US00RE44653E

(19) United States
(12) Reissued Patent
Ban et al.

(10) Patent Number: US RE44,653 E
(45) **Date of Reissued Patent: *Dec. 17, 2013**

(54) USB FLASH MEMORY DEVICE WITH INTEGRAL MEMORY TECHNOLOGY DRIVER

(75) Inventors: Amir Ban, Ramat Hasharon (IL); Dov Moran, Kfar Saba (IL); Oron Ogdan, Jerusalem (IL)

(73) Assignee: SanDisk IL, Ltd, Kfar Saba (IL)

( * ) Notice: This patent is subject to a terminal disclaimer.

(21) Appl. No.: 13/005,501

(22) Filed: Jan. 12, 2011

Related U.S. Patent Documents

Reissue of:
(64) Patent No.: 6,148,354
Issued: Nov. 14, 2000
Appl. No.: 09/285,706
Filed: Apr. 5, 1999

U.S. Applications:
(63) Continuation of application No. 10/292,868, filed on Nov. 13, 2002, now Pat. No. Re. 42,443.

(51) Int. Cl.
*G06F 12/00* (2006.01)

(52) U.S. Cl.
USPC ..... 710/301; 711/115

(58) Field of Classification Search
USPC ..... 710/100, 107, 301, 305; 711/115
See application file for complete search history.

(56) References Cited

U.S. PATENT DOCUMENTS 4,203,001 A 5/1980 Condon ..... 178/3
4,958,342 A 9/1990 Williams et al. ..... 370/79

(Continued)

FOREIGN PATENT DOCUMENTS

CN 1201235 12/1998
DE 195 36 206 4/1996

(Continued)

OTHER PUBLICATIONS

"8X930Ax Universal Serial Bus Microcontroller User's Manual," Intel Corporation, Jul. 1996, 507 pages.

(Continued)

*Primary Examiner* — Glenn A Auve
(74) *Attorney, Agent, or Firm* — Morgan, Lewis & Bockius LLP

(57) ABSTRACT

[A storage unit made of flash array and a USB controller, is implemented to be compatible with then USB specification. The unit includes memory modules which can accept write commands and read commands and are erasable and non-volatile herein referred to as flash modules. The USB/flash controller is configured to provide USB functionality and compatibility alone with common flash operations such as programming reading and erasing the above mentioned components.] *A USB flash memory device includes at least one flash memory module, a USB connector, a USB controller, and an identification structure for holding memory size and manufacturing type information of the flash memory module. The USB controller is configured to send and receive USB-defined data packets to or from a host via the USB connector, to extract operation codes and logical addresses from the USB-defined data packets, and to carry out at least one of reads, writes and erases in the flash memory module in accordance with the USB-defined data packets, and to interpret the operation codes into corresponding commands. The USB controller is configured to activate a respective memory technology driver in accordance with the memory size and manufacturing type information in the identification structure. The activated memory technology driver is configured to perform the commands on the flash memory module corresponding to the logical addresses.*

43 Claims, 7 Drawing Sheets

(56) References Cited

U.S. PATENT DOCUMENTS

| | | | | |
|---|---|---|---|---|
| 4,979,167 | A | 12/1990 | McCool | 370/854 |
| 5,067,105 | A | 11/1991 | Borkenhagen et al. | 711/202 |
| 5,226,168 | A | 7/1993 | Kobayashi et al. | 395/800 |
| 5,291,584 | A | 3/1994 | Challa et al. | 395/500 |
| 5,297,148 | A | 3/1994 | Harari et al. | 371/102 |
| 5,341,330 | A | 8/1994 | Wells et al. | 365/185 |
| 5,375,243 | A | 12/1994 | Parzych et al. | 395/725 |
| 5,388,083 | A | 2/1995 | Assar et al. | 365/218 |
| 5,404,485 | A | 4/1995 | Ban | 395/425 |
| 5,412,798 | A | 5/1995 | Garney | 325/500 |
| 5,420,412 | A | 5/1995 | Kowalski | 325/492 |
| 5,434,648 | A | 7/1995 | Koga et al. | 355/76 |
| 5,437,031 | A | 7/1995 | Kitami | 395/650 |
| 5,459,850 | A | 10/1995 | Clay et al. | 395/497.02 |
| 5,485,519 | A | 1/1996 | Weiss | 380/23 |
| 5,491,774 | A | 2/1996 | Norris et al. | 395/279 |
| 5,509,134 | A | 4/1996 | Fandrich et al. | 395/430 |
| 5,519,843 | A | 5/1996 | Moran et al. | 395/430 |
| 5,524,230 | A | 6/1996 | Sakaue et al. | 395/430 |
| 5,532,945 | A | 7/1996 | Robinson | 713/321 |
| 5,535,197 | A | 7/1996 | Cotton | 370/60 |
| 5,535,357 | A | 7/1996 | Moran et al. | 395/430 |
| 5,544,356 | A | 8/1996 | Robinson et al. | 395/600 |
| 5,546,402 | A | 8/1996 | Niijima et al. | 371/10.2 |
| 5,568,134 | A | 10/1996 | Cannon et al. | 340/825.44 |
| 5,581,723 | A | 12/1996 | Hasbun et al. | 395/430 |
| 5,588,146 | A | 12/1996 | Leroux | 395/601 |
| 5,602,987 | A | 2/1997 | Harari et al. | 395/182.06 |
| 5,630,093 | A | 5/1997 | Holzhammer et al. | 395/442 |
| 5,659,705 | A | 8/1997 | McNutt et al. | 395/442 |
| 5,661,677 | A | 8/1997 | Rondeau et al. | 365/63 |
| 5,663,901 | A | 9/1997 | Wallace et al. | 365/52 |
| 5,684,742 | A | 11/1997 | Bublitz et al. | 365/218 |
| 5,719,808 | A | 2/1998 | Harari et al. | 365/185.33 |
| 5,724,285 | A | 3/1998 | Shinohara | 365/185.25 |
| 5,732,092 | A | 3/1998 | Shinohara | 371/40.2 |
| 5,745,418 | A | 4/1998 | Ma et al. | 365/185.33 |
| 5,760,986 | A | 6/1998 | Morehouse et al. | 360/67 |
| 5,774,744 | A | 6/1998 | Story et al. | 395/847 |
| 5,778,418 | A | 7/1998 | Auclair et al. | 711/101 |
| 5,781,028 | A | 7/1998 | Decuir | 326/30 |
| 5,784,581 | A | 7/1998 | Hannah | 395/290 |
| RE35,881 | E | 8/1998 | Barrett et al. | 707/1 |
| 5,799,168 | A | 8/1998 | Ban | 395/430 |
| 5,815,426 | A | 9/1998 | Jigour et al. | 365/51 |
| 5,822,251 | A | 10/1998 | Bruce et al. | 365/185.33 |
| 5,841,424 | A | 11/1998 | Kikinis | 345/168 |
| 5,845,151 | A | 12/1998 | Story et al. | 395/847 |
| 5,845,313 | A | 12/1998 | Estakhri et al. | 711/103 |
| 5,845,332 | A | 12/1998 | Inoue et al. | 711/163 |
| 5,847,997 | A | 12/1998 | Harada et al. | 365/185.33 |
| 5,860,124 | A | 1/1999 | Matthews et al. | 711/165 |
| 5,860,157 | A * | 1/1999 | Cobb | 711/103 |
| 5,867,417 | A | 2/1999 | Wallace et al. | 365/52 |
| 5,878,142 | A | 3/1999 | Caputo et al. | 380/25 |
| 5,890,016 | A | 3/1999 | Tso | 395/884 |
| 5,928,347 | A | 7/1999 | Jones | 710/129 |
| 5,928,370 | A | 7/1999 | Asnaashari | 714/48 |
| 5,935,244 | A | 8/1999 | Swamy et al. | 713/200 |
| 5,937,423 | A | 8/1999 | Robinson | 711/103 |
| 5,937,425 | A | 8/1999 | Ban | 711/103 |
| 5,938,750 | A | 8/1999 | Shaberman | 710/102 |
| 5,943,692 | A | 8/1999 | Marberg et al. | 711/203 |
| 5,949,882 | A | 9/1999 | Angelo | 380/25 |
| 5,963,983 | A | 10/1999 | Sakakura et al. | 711/202 |
| 5,974,486 | A | 10/1999 | Siddappa | 710/53 |
| 5,991,194 | A | 11/1999 | Jigour et al. | 365/185.04 |
| 5,991,546 | A | 11/1999 | Chan et al. | 395/882 |
| 6,003,135 | A | 12/1999 | Bialick et al. | 713/201 |
| 6,009,480 | A | 12/1999 | Pleso | 710/8 |
| 6,011,486 | A | 1/2000 | Casey | 340/825.44 |
| 6,011,741 | A | 1/2000 | Wallace et al. | 365/221 |
| 6,012,103 | A | 1/2000 | Sartore et al. | 710/8 |
| 6,016,530 | A | 1/2000 | Auclair et al. | 711/6 |
| 6,016,553 | A | 1/2000 | Schneider et al. | 714/21 |
| 6,028,807 | A | 2/2000 | Awsienko | 365/230.02 |
| 6,038,320 | A | 3/2000 | Miller | 380/44 |
| 6,038,640 | A | 3/2000 | Terme | 711/115 |
| 6,044,428 | A | 3/2000 | Rayabhari | 710/129 |
| 6,058,441 | A | 5/2000 | Shu | 710/100 |
| 6,067,625 | A | 5/2000 | Ryu | 713/202 |
| 6,069,827 | A | 5/2000 | Sinclair | 365/185.29 |
| 6,081,850 | A | 6/2000 | Garney | 710/15 |
| 6,088,755 | A | 7/2000 | Kobayashi et al. | 710/129 |
| 6,088,802 | A | 7/2000 | Bialick et al. | 713/200 |
| 6,102,103 | A | 8/2000 | Zobel et al. | 165/10 |
| 6,109,939 | A | 8/2000 | Kondo et al. | 439/140 |
| 6,128,675 | A | 10/2000 | Ko | 710/23 |
| 6,131,141 | A | 10/2000 | Ravid | 711/112 |
| 6,137,710 | A | 10/2000 | Iwasaki et al. | 365/52 |
| 6,145,045 | A | 11/2000 | Falik et al. | 710/129 |
| 6,145,046 | A | 11/2000 | Jones | 710/129 |
| 6,148,354 | A | 11/2000 | Ban et al. | 710/102 |
| 6,151,657 | A | 11/2000 | Sun et al. | 711/103 |
| 6,163,816 | A | 12/2000 | Anderson et al. | 710/8 |
| 6,168,077 | B1 | 1/2001 | Gray et al. | 235/375 |
| 6,170,743 | B1 | 1/2001 | Okaue et al. | 235/380 |
| 6,174,205 | B1 | 1/2001 | Madsen et al. | 439/638 |
| 6,182,162 | B1 | 1/2001 | Estakhri et al. | 710/11 |
| 6,199,122 | B1 | 3/2001 | Kobayashi | 710/36 |
| 6,216,230 | B1 | 4/2001 | Rallis et al. | 713/185 |
| 6,226,202 | B1 | 5/2001 | Kikuchi | 365/185.33 |
| 6,253,300 | B1 | 6/2001 | Lawrence et al. | 711/173 |
| 6,279,069 | B1 | 8/2001 | Robinson et al. | 711/103 |
| 6,279,114 | B1 | 8/2001 | Toombs et al. | 713/300 |
| 6,286,087 | B1 | 9/2001 | Ito et al. | 711/164 |
| 6,292,863 | B1 | 9/2001 | Terasaki et al. | 710/129 |
| 6,330,624 | B1 | 12/2001 | Cromer et al. | 710/37 |
| 6,330,648 | B1 | 12/2001 | Wambach et al. | 711/163 |
| 6,361,369 | B1 | 3/2002 | Kondo et al. | 439/630 |
| 6,370,603 | B1 | 4/2002 | Silverman et al. | 710/72 |
| 6,385,667 | B1 | 5/2002 | Estakhri et al. | 710/8 |
| 6,418,501 | B1 | 7/2002 | Gama et al. | 710/305 |
| 6,424,524 | B2 | 7/2002 | Bovio et al. | 361/686 |
| 6,425,084 | B1 | 7/2002 | Rallis et al. | 713/185 |
| 6,434,648 | B1 | 8/2002 | Assour et al. | 710/102 |
| 6,453,414 | B1 | 9/2002 | Ryu | 713/2 |
| 6,457,099 | B1 | 9/2002 | Gilbert | 711/115 |
| 6,488,542 | B2 | 12/2002 | Laity | 439/676 |
| 6,493,770 | B1 | 12/2002 | Sartore et al. | 710/8 |
| 6,671,808 | B1 | 12/2003 | Abbott et al. | 713/200 |
| 6,763,399 | B2 | 7/2004 | Margalit et al. | 710/13 |
| 6,920,553 | B1 | 7/2005 | Poisner | 713/2 |
| 2003/0057285 | A1 | 3/2003 | Okaue et al. | 235/492 |
| 2004/0039854 | A1 | 2/2004 | Estakhri et al. | 710/11 |
| 2006/0230202 | A1 | 10/2006 | Lee | 710/62 |

FOREIGN PATENT DOCUMENTS

| | | |
|---|---|---|
| DE | 196 36 087 | 9/1997 |
| DE | 196 31 050 | 2/1998 |
| EP | 0 392 895 | 10/1990 |
| EP | 0 152 024 | 6/1991 |
| EP | 0 703 544 | 3/1996 |
| EP | 0 712 067 | 5/1996 |
| EP | 0 859 325 | 8/1998 |
| EP | 0 883 083 | 12/1998 |
| EP | 0 883 084 | 12/1998 |
| EP | 0 890 905 | 1/1999 |
| EP | 0 929 043 | 7/1999 |
| EP | 1 001 329 | 5/2000 |
| EP | 0 912 939 | 9/2001 |
| EP | 0 917 064 | 11/2001 |
| EP | 0 775 956 | 5/2002 |
| FR | 2 719 939 | 11/1995 |
| GB | 2 291 990 | 2/1996 |
| GB | 2298063 | 8/1996 |
| GB | 2 304 428 | 3/1997 |
| GB | 2 325 997 | 12/1998 |
| JP | 01 115928 | 5/1989 |
| JP | 05 016746 | 1/1993 |
| JP | 06-111589 | 4/1994 |
| JP | 06195524 | 7/1994 |
| JP | 08 171623 | 7/1996 |

(56) References Cited

FOREIGN PATENT DOCUMENTS

| | | |
|---|---|---|
| JP | 08-510072 | 10/1996 |
| JP | 09-069067 | 3/1997 |
| JP | 10-063442 | 3/1998 |
| JP | 10-063804 | 3/1998 |
| JP | 10-105296 | 4/1998 |
| JP | 10-261774 | 9/1998 |
| JP | 10-334206 | 12/1998 |
| JP | 11-015928 | 1/1999 |
| JP | 11-025681 | 1/1999 |
| JP | 11-053485 | 2/1999 |
| JP | 11-086578 | 3/1999 |
| JP | 2000-207137 | 7/2000 |
| KR | 1998-76475 | 11/1998 |
| KR | 1998-79601 | 11/1998 |
| KR | 1999-6604 | 1/1999 |
| TW | 550454 | 9/2003 |
| WO | WO 87/07063 | 11/1987 |
| WO | WO 93/19419 | 9/1993 |
| WO | WO 94/20906 | 9/1994 |
| WO | WO 96/13004 | 5/1996 |
| WO | WO 98/03915 | 1/1998 |
| WO | WO 98/07255 | 2/1998 |
| WO | WO 98/29830 | 7/1998 |
| WO | WO 98/55912 | 12/1998 |
| WO | WO 99/01820 | 1/1999 |
| WO | WO 99/04368 A1 | 1/1999 |
| WO | WO 99/08196 | 2/1999 |
| WO | WO 99/12101 | 3/1999 |
| WO | WO 99/45460 | 9/1999 |
| WO | WO 99/49470 | 9/1999 |
| WO | WO 00/07088 | 2/2000 |
| WO | WO 00/42491 | 7/2000 |
| WO | WO 00/49488 | 8/2000 |
| WO | WO 01/24054 | 4/2001 |
| WO | WO 03/030180 | 4/2003 |
| WO | WO 2007/146373 A2 | 12/2007 |

OTHER PUBLICATIONS

"8x930Hx Universal Serial Bus Microcontroller—Product Review," Intel, Oct. 1996, 34 pages.

"A TrueFFS and FLite Technical Overview of M-Systems' Flash File Systems, Technology Brief V1.01," M-Systems Flash Disk Pioneers, Oct. 1996, 9 pages.

"Aladdin Announces eToken—Next Generation Security Key Based on Universal Serial Bus Port," http://web.archive.org/web/20040414101246/www.ealaddin.com/news/1999/etokens/etoken.asp, Jan. 19, 1999, 3 pages.

"Apple USB FAQ," Apple Computer Inc., 1999, http://www.apple.com/usb/pdf/usb_FAQ-c.pdf, 3 pages.

"Application Note (AP-684) Understanding the Flash Translation Layer (FTL) Specification," Intel Corporation, Dec. 1998, 20 pages.

"CY7C63000, CY7C63001, CY7C63100, CY7C63101, CY7C63200, CY7C63201—Universal Serial Bus Microcontroller," Cypress Semiconductor, Inc., Jun. 26, 1997, 27 pages.

"Digital Eyes News—Q3 1998," Scanner and Digital Camera News, Q3 1998—Digital Eyes, http://www.image-acquire.com/news/98/q3.shtml, pp. 1-9.

"DiskOnChip® 2000—The Smallest Flash Disk in the World," M-Systems Flash Disk Pioneers, Oct. 13, 1997, 5 pages.

"DiskOnChip® 2000 MD-2200 Data Sheet," M-Systems Flash Disk Pioneers, Jul. 1997, 15 pages.

"Flash Memory," Wikipedia, http://en.wikipedia.org/wiki/Flash_memory, retrieved Feb. 20, 2006, 5 pages.

"Flash PC Card 2000 Data Sheet," M-Systems Flash Disk Pioneers, Jun. 1997, http://www.m-sys.com/pcmcia.htm, Oct. 13, 1997, 15 pages.

"FRCN Digital Imaging—SanDisk ImageMate USB CF Card Reader," Jul. 12, 1999, http://www.quicknet.com/~fren/SanDiskUSB.html.

"FujiFilm—Image Memory Card Reader SM-R1 for Windows 98 / Macintosh—Owners' Manual," 21 pages in English, 21 pages in French, 21 pages in German, 1999, 71 pages.

"Generic Device Driver for Personal Computer Removable Devices," IBM Technical Disclosure Bulletin, vol. 37, Issue 1, Jan. 1994, pp. 487-490.

"Hardlock USB," Aladdin, http://aladdin.de/produkte/hardlock/harlock_usb.html, retrieved Feb. 13, 2006, 2 pages.

"IBM Smart Card Solution Elements—Overview," Jul. 1997, 26 pages.

"Information Technology—Reduced Block Commands, Working Draft.," T10/1228D, Rev. 7, Mar. 8, 1999, 56 pages.

"Information Technology—Reduced Block Commands," Working Draft, T10/1228D Committee, Revision 6, Feb. 26, 1999, 53 pages.

"Intel AP-684—Application Note: Understanding the Flash Translation Layer (FTL) Specification," Intel Corporation, Dec. 1998, 20 pages.

"Intel AP-686—Application Note: Flash File System Selection Guide," Intel Corporation, Dec. 1998, 16 pages.

"Interfacing the Intel Flash 28F001BX-T to Your 186 Based System," Intel Corporation, Mar. 29, 1998, 14 pages.

Introducing the FujiFilm MX-2700, the World's Smallest 2.3 Million-Pixel Digital Camera, http://www.businesswire.com/webbox/bw.020399/1096161.htm, Feb. 3, 1999, 2 pages.

"M-Systems' DiskOnChip® 2000 Evaluation Board," Jul. 1997 1 page.

"PC Card Standard Release 7," PCMCIA, vols. 1 through 11, http://www.pcmcia.org/pccard.htm, Mar. 2000.

"PC Card Standard, vol. 1, Overview and Glossary," PCMCIA/JEIDA, first printing Feb. 1999, 40 pages.

"PC Card Standard, vol. 7, Media Storage Formats Specification," PCMCIA/JEIDA, first printing Feb. 1999, 53 pages.

"PC Card Standard, vol. 8, PC Card ATA Specification," PCMCIA/JEIDA, first printing Feb. 1999, 39 pages.

"PC-104 PCMCIA Module—User's Manual for Models PCM-3110, PCM-3111, PCM-3115B, PCM-3110B, PCM-3113, PCM-3114," http://www.tempustech.com/pdf/3110manual.pdf, Jul. 1997, 78 pages.

"PCMCIA Flash Disk—Removable Flash Disk for Embedded & Mobile Computers," M-Systems Flash Disk Pioneers, Oct. 13, 1997.

"PCMCIA SRAM & Linear Flash Cards by C1-Tech, Simple Technology, Centennial, Intel and KingMax," Primary Simulation, Inc., 1995, 5 pages.

"Portable Computing: Microsoft Delivers Second Phase of Portable Computing Initiative; Flash File System Facilitates Application Development of MS-DOS, Windows Software," Edge: Working Group Computing Report, vol. 3, No. 101, Apr. 27, 1992, 4 pages.

"Product Brief—AlphaPC 164LX Motherboard," Alpha Processor Inc., Jan. 1999, 2 pages.

"Questions and Answers about DiskOnChip® 2000," M-Systems Flash Disk Pioneers, Jul. 1997, 4 pages.

"Reduce Block Commands (RBC), Draft Proposal," T10/97-260r2, Rev. 1, Jan. 16, 1998, 40 pages.

"Report on the Japanese Nikon 900 Firmware Upgrade," Digital Camera News, Jan. 30, 1999, 34 pages.

"SanDisk ImageMate CompactFlash External Drive, Product Background," SanDisk Corporation, Jan. 1999, 2 pages.

"SanDisk Introduces New USB ImageMate; SanDisk ImageMate is a low-cost, easy-to-use external CompactFlash drive for desktop PCs and the new Apple iMac," Business Wire, Oct. 27, 1998, http://library.northernlight.com/FC19981027...JqDmQPWAVRU0UIGRREdQx5HQ%3D%3D&cbx=0%3B1004, 3 pages.

"SL11R USB Controller / 16-Bit RISC Processor Data Sheet," Cypress Semiconductor Corp., Dec. 3, 2001, pp. 1-85.

"Sony Announces Memory Stick™ for Audio Application 'Memory Stick™ Walkman' and 'MagicGate Memory Stick™' to be launched," Sep. 22, 1999, 3 pages.

"SOYO SY-61EB Mainboard—Quick Start Guide," Soyo Computer, Ver. 1.0, Sep. 1998, 14 pages.

"The New WIBU-KEY Copy Protection System v.2.50 Press Release," Griffin Technologies, 1998, 3 pages.

(56) References Cited

OTHER PUBLICATIONS

"Universal Serial Bus Mass Storage Class—Bulk-Only Transport," RC3, Rev. 1.0, Mar. 29, 1999, 25 pages.
"Universal Serial Bus Mass Storage Class—UFI Command Specification," USB Implementers Forum, Rev. 10, Dec. 14, 1998, pp. 1-53.
"USB ATAPI Intelligent Cables," SCM Microsystems, 1999, 2 pages.
"User Manual—DiskOnChip® 2000 PIK (Programmer and Integrator Kit)," M-Systems Flash Disk Pioneers, Jul. 1997, 7 pages.
"User Manual—DiskOnChip® 2000 Utilities," M-Systems Flash Disk Pioneers, Jul. 1997, 8 pages.
"User Manual—DiskOnChip®-EVB ISA Adaptor for the DiskOnChip®," M-Systems Flash Disk Pioneers, Nov. 1996, 6 pages.
"VxWorks 5.4," WindRiver Systems, 1999, 3 pages.
"WindWord Newsletter—News and Information for Wind River Systems Customers," WindRiver Systems, Winter 1998, 32 pages.
"Word-Wide FlashFile™ Memory Family 28F160S5, 28F320S5, Advance Information," Intel, Jun. 1997, 51 pages.
"Written Comments by the Third Party Requester in an Inter Partes Reexamination," filed in Reexamination Control No. 95/000,384, dated Apr. 13, 2010, 49 pages.
Anderson, D., "Universal Serial Bus System Architecture," MindShare, Inc., Jan. 1997, pp. 18-19, 24, 28-31, 48, 56-57, 83, . 95, 98-104, 109-111, 135-137, 146, 148, 151-153, 155-156, 178, 185, 233, 237, 247-248, 250-251, 270, 273.
Auclair, D., "Optimal Solid State Disk Architecture for Portable Computers," Presented at The Silicon Valley PC Design Conference, Jul. 9, 1991, 5 pages.
Austrian Patent Office Search Report and Written Opinion issued in related Singapore Patent Application 200604735-1 on Nov. 16, 2009, 8 pages.
Ben-Zeev, Y., "AP-DOC-010 Application Note—Designing with the DiskOnChip® 2000," M-Systems Flash Disk Pioneers, Jul. 1997, 4 pages.
Burskey. D., "Flash and EEPROM technologies combine on feature-rich MCUs," Electronic Design, http://cma.zdnet.com, May 26, 1997, 11 pages.
Certified copy of U.S. Appl. No. 60/116,006, filed Jan. 15, 1999, entitled "USB-Compliant Personal Key," 23 pages.
Claims as issued in U.S. Patent No. 6,829,672, Reexamination Control No. 95/000,384.
Cypress Semiconductor, "Universal Serial Bus Microcontroller," Cypress Semiconductor Corporation, San Jose, CA, Oct. 1996—Revised Jun. 26, 1997, 35 pages.
Davis, J., "Apple Licensing FireWire for a Fee," CNET News, Jan. 16, 1999, 4 pages.
Decision Granting-in-Part Petition for Extension of Time dated Dec. 12, 2008, 4 pages.
Diamond, "Rio 500 Getting Started Guide," Diamond Multimedia Systems © 1999, 2 pages.
Dipert et al., "Designing with Flash Memory," Annabooks © 1993, 1994, San Diego, CA, 431 pages.
English translation of FR 2 719 939, published Nov. 17, 1995, 32 pages.
European Patent Office Extended Search Report issued in co-pending European Patent Application 09010734.3 on Apr. 8, 2010, 9 pages.
European Patent Office Extended Search Report, issued in co-pending European Patent Application 09013951.0 on Apr. 6, 2010, 8 pages.
European Patent Office Interlocutory decision in Opposition proceedings dated Jan. 21, 2009, 38 pages.
European Patent Office Summon To Attend Oral Proceeding in EP 1092193, Nov. 20, 1997, 20 pages.
Fantom Drives, "Fantom Drives Embraces USB & iMac by Announcing USB Hard Disk Drive and CD-ReWritable Technology," Fantom USB Highlights, Jan. 5, 1999, 3 pages, http://web.archive.org/web/20000526201655/fantomdrives.com/main_si.
Fantom Drives, "Fantom Drives Ships USB Hard Disk Drives," Fantom Drives, Apr. 5, 1999, 1 page, http://www.fantomdrives.com/press/articles/usbrelease.html.
Grant, J., "A Historical Look at Hardware Token Compromises," Black Hat USA 2004 Briefings, Jul. 28, 2004, 64 pages.
Gupta, R.K., et al., "Introducing Core-Based System Design," IEEE, Oct.-Dec. 1997, pp. 15-25.
IC Card Expo Conference Proceedings, Santa Clara, CA, Jul. 25-27, 1994, 54 pages.
IDS with references in Re-exam Control No. 95/000,384, filed Jul. 9, 2008, 73 pages.
"IEEE Standard for a High Performance Serial Bus," IEEE, IEEE Std 1394-1995, © 1996 by Institute of Electrical and Electronics Engineers, Inc., New York, NY, 393 pages.
"Common Flash Memory Interface (CFI) Specification," Intel Corp., Release 1.1, May 30, 1997, 16 pages.
Inter Partes Reexamination Communication / Office Action dated Nov. 3, 2008, 22 pages.
International Standard ISO/IEC 7816-1 through 7816-8, editions dated Sep. 1, 1995 through Oct. 1, 1999.
Japanese Patent Office Action issued in co-pending Japanese Patent Application No. 2005-241989, dated Apr. 9, 2010, 8 pages.
Japanese Patent Office Action issued in co-pending Japanese Patent Application No. 2007-085679, dated Apr. 9, 2010, 6 pages.
Leibson, S., "Nonvolatile, in-circuit-reprogrammable memories," EDN Magazine, Jan. 3, 1991, 12 pages.
Mendelsohn, A., "A Solid State Disk Puts Flash to Work," Computer Design, Feb. 1994, 4 pages.
M-Systems, "DiskOnChip® 2000 MD2200, MD2201 Data Sheet," M-Systems Inc., Jun. 1998, 15 Pages.
M-Systems, "FlashLite 100 PC Card," M-Systems Flash Disk Pioneers, Product Specifications, Jul. 1998, 34 pages.
Multimedia Workshop Industry News, http://www.m2w.net/news/981019.html, Oct. 22, 1998, 3 pages.
Paripatyadar, R., "1394 Overview," IEEE 802 Plenary Tutorial, Nov. 10, 1998, 19 pages.
Patent Owner's Response to Office Action, Feb. 3, 2009, 162 pages.
Person, R., "Special Edition Using Windows 95," Que Corporation, Chapter 9, 1996, pp. 265-273.
Philips, "PDIUSBD12 USB interface device with parallel bus," Philips Semiconductors—Asia Product Innovation Centre Data Sheet, Jan. 8, 1999, 45 pages.
Request for Inter Partes Reexamination of U.S. Patent No. 6,829,672, dated Jul. 8, 2008, with transmittal form, 109 pages.
Roberts, R., "NCITS-330 T10/1240-D Working Draft—Information Technology—Reduced Block Commands," Revision 10a, Aug. 18, 1999, 46 pages.
Schmidt, D., "AP-DOC-011 Application Note—Write Protecting the DiskOnChip® 2000," M-Systems Flash Disk Pioneers, Aug. 1997, 4 pages.
Shmueli, S., Testimony relevant to SanDisk in Singapore proceedings, Apr. 30, 2004, p. 135, line 9 through p. 137, line 23, and p. 139, line 8 through p. 140, line 18.
Toshiba, MOS Memory (Non-Volatile) Data Book, Toshiba Corporation, Sep. 1996, 166 pages.
Toshiba, "Toshiba MOS Digital Integrated Circuit Silicon Gate CMOS," Toshiba Corporation, Jul. 7, 1997, 34 pages.
Translation of Japanese Office Action dated Nov. 2, 2007, for Application No. 2003-533286, 8 pages.
Transmittal of Communication to Third Party Requester Inter Partes Reexamination / Decision Refusing Entry of Papers, re paper entitled "Expedited Petition Under 37 C.F.R. §§ 1.182 and 1.183" dated Apr. 6, 2009, 7 pages.
Transmittal of Communication to Third Party Requester Inter Partes Reexamination / Decision Refusing Entry of Papers re paper entitled "Opposition to Patent Owner's Petition Under 37 C.F.R. § 1.956", dated Apr. 6, 2009, 7 pages.
Transmittal of Communication to Third Party Requester Inter Partes Reexamination / Decision Granting-in-Part Petition to Extend Page Limit for Response to Office Action, dated Apr. 6, 2009, 7 pages.
Universal Serial Bus Mass Storage Class—Bulk-Only Transport, Revision 1.0, Sep. 31, 1999, pp. 1-22.
Universal Serial Bus Mass Storage Class—Control/Bulk/Interrupt (CBI) Transport, Revision 1.0, Dec. 14, 1998, Technical Editors—Stevens, C.E., et al., pp. 1-26.

(56) References Cited

OTHER PUBLICATIONS

Universal Serial Bus Mass Storage Class—UFI Command Specification, Revision 1.0, Dec. 14, 1998, pp. 1-53.
Universal Serial Bus Mass Storage Class Specification Overview, V1.0 Revision, Oct. 22, 1998, Technical Editor—M. Williams, pp. 1-8.
Universal Serial Bus Specification—Compaq, Intel, Microsoft, NEC, Revision 1.1, Sep. 23, 1998, pp. i-xvi (table of contents), 1-311, +4 pages (Engineering Change Notice—USB Cable Parameters, approved Nov. 23, 1999 by the USB Core Team).
USB "Universal Serial Bus Device Class Definition for Mass Storage Devices, 0.90c Draft Revision," Appendix B Solid State SCSA Command Set, 1996, 7 pages.
USB Universal Serial Bus Mass Storage Class—Bulk-Only Transport, Revision 1.0, 1999, pp. 1-22.
USB XpressSCSI—USB to SCSI Convert Cable—User's Manual for Models USB-SCSI-DB25 and USB-SCSI-HD50, Microtech International, Inc., Ver. 1, 1999, 37 pages.
Wong, T.K.P., "An Embedded Chip for USB Application: From the Architecture to Implementation," Int'l IC '99 Conf. Proceedings, Apr. 1999, 10 pages.
Wright, M., "To the Victor Will Go the Spoils in the Tiny-Flash-Card Battle," EDN Access, Jan. 16, 1997, 6 pages.
Written Comments by the Third Party Requester in an Inter Partes Reexamination, Patent Reexamination Control No. 95/000,384, May 20, 2009, 75 pages (Redacted).
EP Office Action for Related EP Application No. 09 010 734.3, Dated Aug. 8, 2011, 6 pages.
EP Office Action for Related EP Application No. 09 013 951.0, Dated Aug. 8, 2011, 5 pages.
ATA-2 , PCguide.com/rref/hdd,if/ide/stdATA2-c.html, Apr. 17, 2001, 2 pages.
Australian Patent Office Search Report, Application No. SG200306984-6, Jun. 10, 2005, 3 pages.
European Search Report, 06013645.4, Oct. 17, 2008, 7 pages.
Anderson, D., "FireWire System Architecture," Dec. 17, 1998, 544 pages.
Information Technology, Reduced Block Commands, Working Draft, T/10/1228D, Revision 6, Feb. 26, 1999, 53 pages.
Intel, "Product Review, 8x930Hx Universal Serial Bus Microcontroller," Oct. 1996, 34 pages.
Integrated Drive Electronics / AT Attachment (IDE/ATA) Interface, http://www.pcguide.com/ref/hdd/if/ide/index-i.htm, Apr. 17, 2001, 4 pages.
International Search Report PCT/US00/07087, May 25, 2000, 1 page.
International Search Report PCT/US98/12918, Oct. 26, 1998, 1 page.
Keyspan Introduces USB Expansion Card Enabling Macintosh Computers to Use SanDisk USB ImageMate, Business Wire, Jan. 5, 1999, 2 pages.
Logical Block Addressing, Wikipedia, Apr. 28, 2011, 5 pages.
Japanese Official Action, Patent Application No. 2003-533286, Nov. 2, 2007, 8 pages.
Reduced Block Commands (RBC), Draft Proposal (T10/97-260r2), Revision 1, Jan. 16, 1998, 40 pages.
Universal Serial Bus Specification, Revision 1.1, Sep. 23, 1998, 182 pages.
Cho, H. D. et al., "Experiments of Video Communications via Mobile Networks Supporting Data Re-transmission," LG Information and Communications, ISO/IEC JTC1/SC29/WG11, MPEG99/4459, Mar. 1999, 3 pages.
Aladdin's eToken cracked, http://www.securiteam.com, May 5, 2000, 5 pages.
"Availability of Universal Serial Bus Support in Windows 95," http://support.microsoft.com/default.aspx?scid=kb;en-us;253756, May 12, 2003, 2 pages.
"DiskOnChip® 2000 Quick Installation Guide," M-Systems Flash Disk Pioneers, Jul. 1997, 1 page.
"Imaging Press Release—Hagiwara 'FlashGate' for SmartMedia up to 130X faster than Serial Devices," Digital Eyes News, http://www.image-acquire.com/news/99/q2/hagi9921.html., Apr. 19, 1999, 2 pages.
"Memory Stick Format," http://www.memorystick.org/mseasy/eng.application/, Aug. 4, 2003, 19 pages.
"Product Review—Action Tec CameraConnect Pro," Action Tec Camera Connect Review from Digital Eyes, http://www.image-acquire.com/articles/storage/atcamconnect.shtml, Apr. 1, 1999, 3 pages.
"Product Review—Hagiwara FlashGate USB," Hagiwara Flash Gate USB Review from Digital Eyes, http://www.image-acquire.com/articles/storage/hagiwarausb.html, Apr. 30, 2003, 2 pages.
"Product Review—SanDisk ImageMate USB," SanDisk ImageMate USB Review from Digital Eyes, http://www.image-acquire.com/articles/storage/sdimagemateusb.shtml, Apr. 29, 2003, 2 pages.
Steve's DigiCams, Hardware Reviews—Camera Connect Pro, External PC Card Read/Write Drive, http://www.steves-digicam.com/camera_connect_pro.html, Jul. 17, 1999, 4 pages.
"What is Memory Stick—Shape?" http://www.memorystick.org/topics/eng/aboutms/feat_outline.html, Aug. 7, 2003, 1 page.
"What is Memory Stick?" http://www.memorystick.org/topics/eng/aboutms/, Aug. 4, 2003, 15 pages.
"Will IEEE 1394 Ultimately Replace USB? White Paper Comparing Universal Serial Bus (USB) and IEEE 1394 (FireWire) Technologies," American Megatrends, Inc., http://www.ami.com/support/doc/1394_USB.pdf, 1996, 7 pages.
Actiontec—Broadband Technology Made Easy, "Support Info—CameraConnect Pro," http://www.actiontec.com/support/readers/cameraconpro.html, 2003, 2 pages.
Advertising—"MacHASP USB—Protects Your Software," Aladdin—The Professional Choice, 1998, 2 pages.
FujiFilm—Image Memory Card Reader SM-R1 for SmartMedia, Owner's Manual, Apr. 1, 1999, 16 pages.
FujiFilm SM-R1 Memory Card Reader, TwoMobile Home of the Investigative Mobile Reviewers, http://web.archive.org/web/20001206024200/http://www.twomobile.com/rev_smrlreader.html, Dec. 6, 2000, 3 pages.
HP Jornada PC Companion, Jornada 430se—the Palm-Size PC that meets your needs at work and play, http://web.archive.org/web/19991128125415/http://www.hp.com/jornada/pr.../overview/htm, Nov. 28, 1999, 3 pages.
HP Jornada PC Companions, Product Specifications—HP Jornada 430se, http://web.archive.org/web/19991128142035/www.hp.com/jornada/produc.../prod_spec.htm, Nov. 28, 1999, 5 pages.
HP Jornada PC Companions, Software & Hardware Solutions—Microsoft Windows CE 2.11, http://web.archive.org/web/19991127141058/www.hp.com/jornada/sol.../oth_soft/rom.htm, Nov. 28, 1999, 2 pages.
Pheng, L.K., comparison of the block diagrams of the SanDisk ImageMate USB CF Card Reader, the Patent and the SlimDisk, Apr. 1, 1999, 6 pages.
Pheng, L.K., description of "SanDisk ImageMate USB CF Card Reader," Apr. 1, 1999, 1 page.
Sharp Model OZ-730/OZ-750 Electronic Organizer—Operation Manual (74 pgs), Quick Reference Guide (11 pgs), Quick Start Guide (9 pgs), Oct. 20, 1999.
Sharp PC Interface Hardware (Docking Station), Model CE-61T—Operation Manual, 1997, 5 pages.
Sharp Wizard, IntelliSync for Sharp Wizard—User's Guide, Day Time Organizer for Sharp Electronic Organizer with IntelliSync Translator (34 pgs), Installation Instructions (2 pgs), Getting Started Guide (39 pgs), 1997.
Sharp Wizard, Model OZ-570 Electronic Organizer—Operation Manual (103 pgs), Quick Reference Guide (17 pgs), Sep. 1998.
USB Drive: Products, http://web.archive.org/web/20020328072516/http://www.usbdrive.com/products/index.htm1, 1999, 2 pages.
USB-SCSI & ATA/ATAPI Intelligent Cables, http://www.multiwave.co.kr/products/scm_product3.html, Jun. 20, 2003, 1 page.
Windows CE Handheld PC Hardware Features, http://web.archive.org/web/19991012094107/microsoft.com/windowsce/products/hpc/hwspecs.asp, Jul. 14, 1999, 1 page.

(56) References Cited

OTHER PUBLICATIONS

SanDisk IL Ltd., Notice of Acceptance, AU 2010257369, Sep. 11, 2012, 3 pgs.
SanDisk IL Ltd., Office Action, AU 2010257369, Aug. 22, 2011, 2 pgs.
SanDisk IL Ltd., Office Action, CN 200810087669.3, Feb. 2, 2012, 4 pgs.
SanDisk IL Ltd., Office Action, JP 2007-85679, Mar. 30, 2012, 2 pgs (in Japanese only).
SanDisk IL Ltd., Search Report, SG 201009717-8, Nov. 16, 2012, 6 pgs.
MacIIASP USB, Software Protection via the USB, Aladdin—The Professional Choice, brochure: Oct. 1998, 10 pgs.
Shmueli, Description of Aladdin eToken and Rainbow iKey, Jan. 19, 1999, 1 pg.
Shmueli, Description of Lexar Jumpshot Cable, 1999, 2 pgs.
Shmueli, Description of SanDisk ImageMate USB CompactFlash Reader, 1999, 3 pgs.
U2 Only Disk User's Manual, Netac Technology Co., www.bestusbdrive.com/downloads/u2english.pdf, Mar. 25, 2003, 1 pg.
USB Special, Aladdin—the Key to Software and Security, Aladdin Knowledge Systems Inc., Sep. 1998, 8 pgs.
SanDisk IL Ltd., First Examination Report, IN 1900/DEL/2004, Mar. 1, 2013, 1 pg.

* cited by examiner

Figure 1 – Background Art USB Token Packet Structure
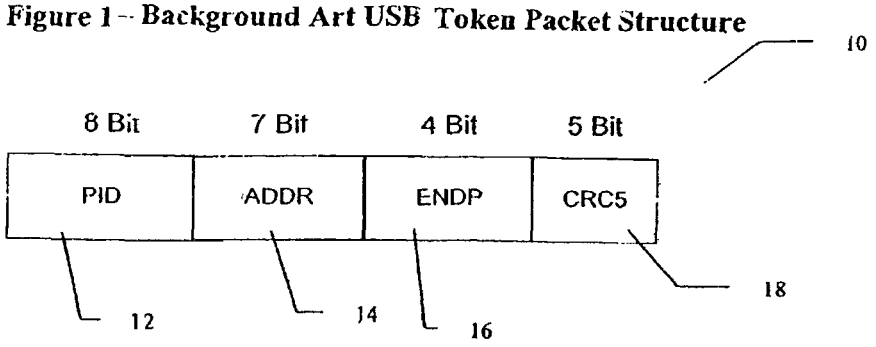
Figure 2 – Background Art USB Data Packet Structure
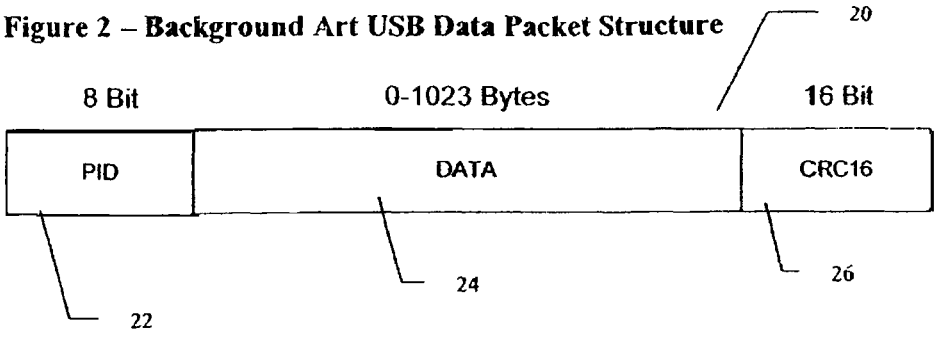
Figure 3 – Background Art USB Handshake Packet
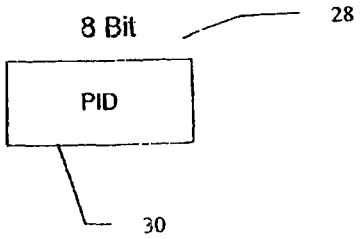

Figure 4 – Functional Blocks of a Background Art USB device
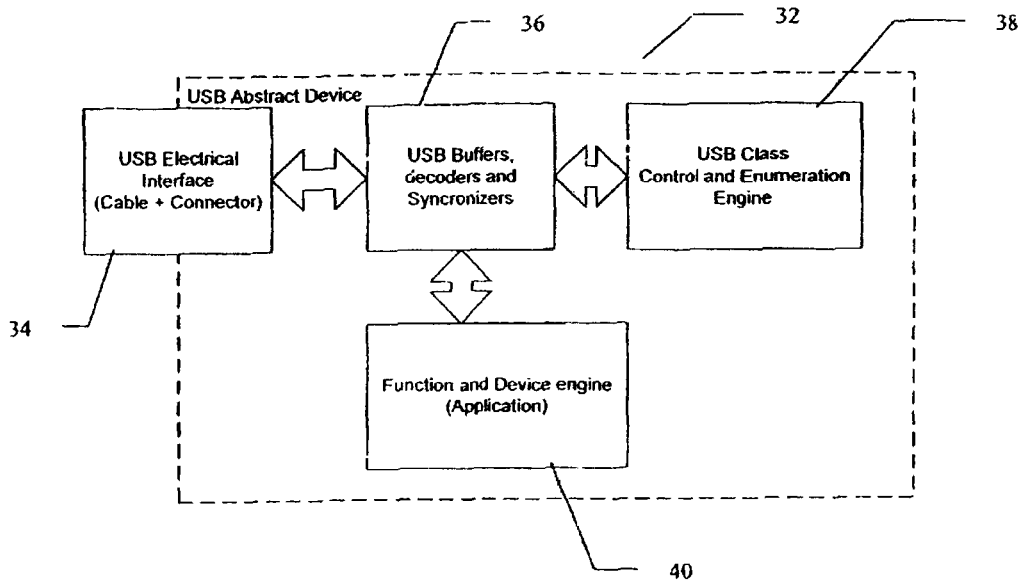

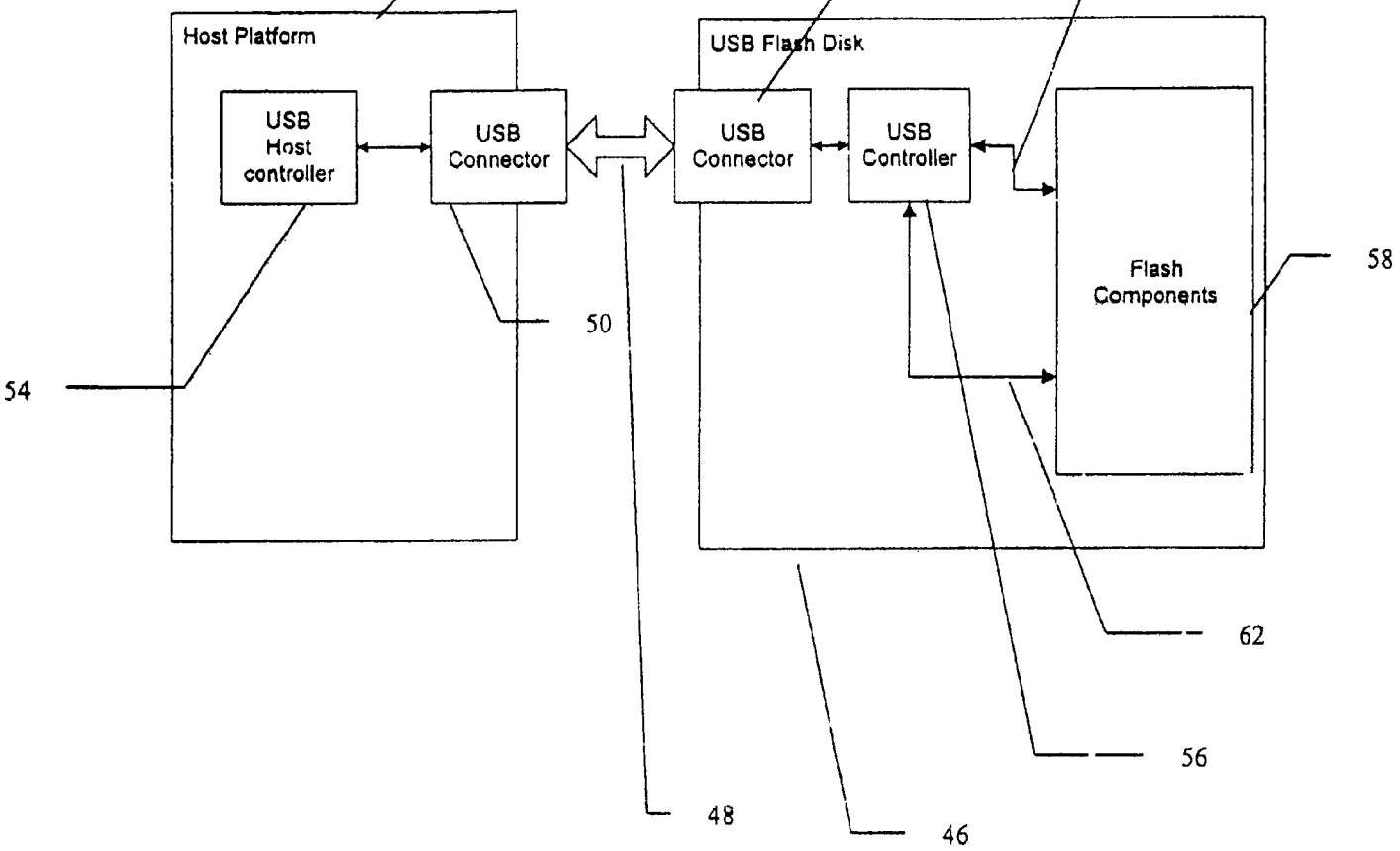
Figure 5 – A Computer Host System with a USB Flash Memory Device

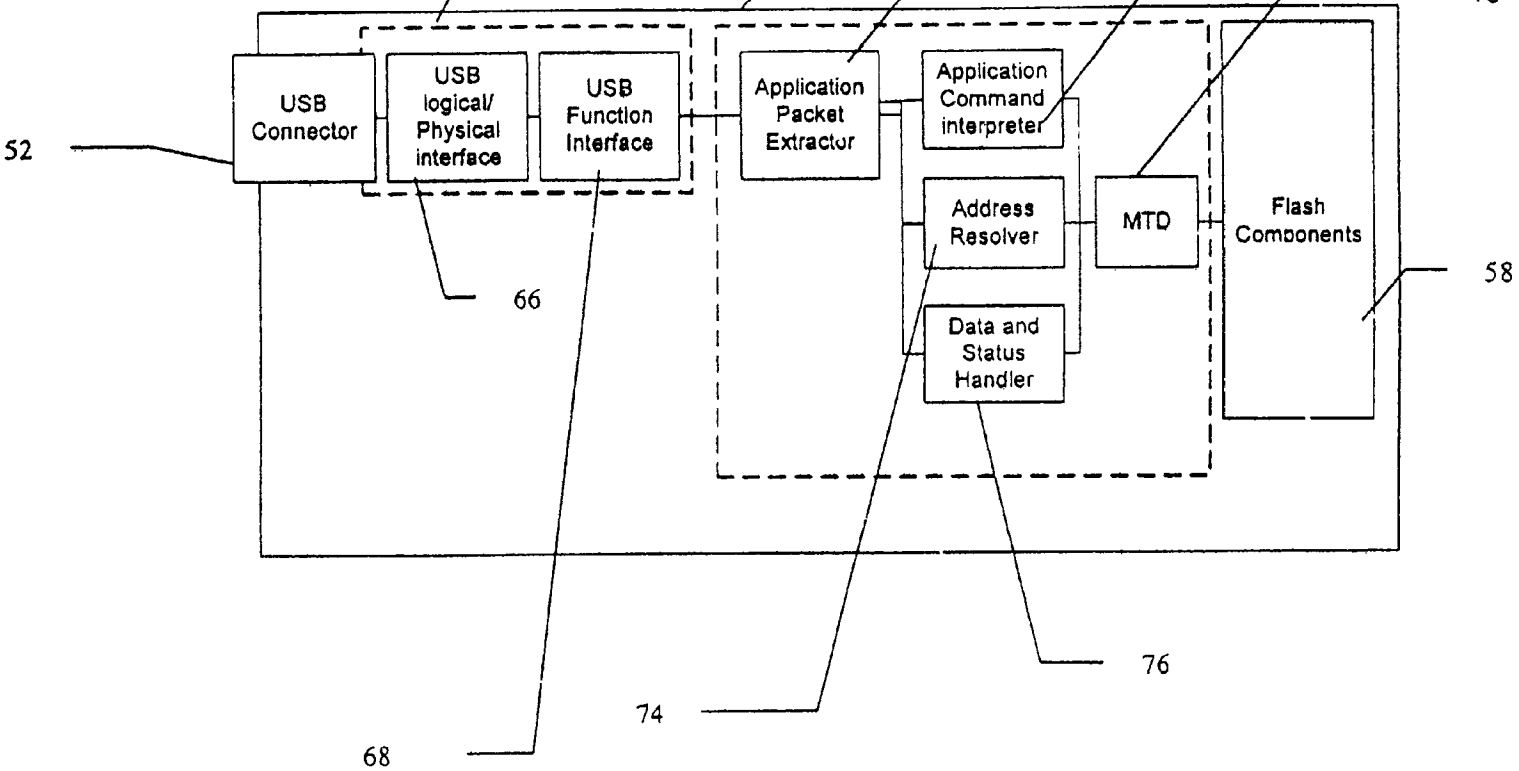
Figure 6 – Detailed Functional Blocks of USB Flash Memory Device

Fig 7 – Flash Identification Request Packet
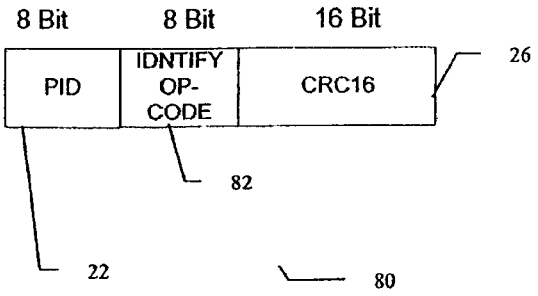
Fig 8 – Flash Identification Replay Packet
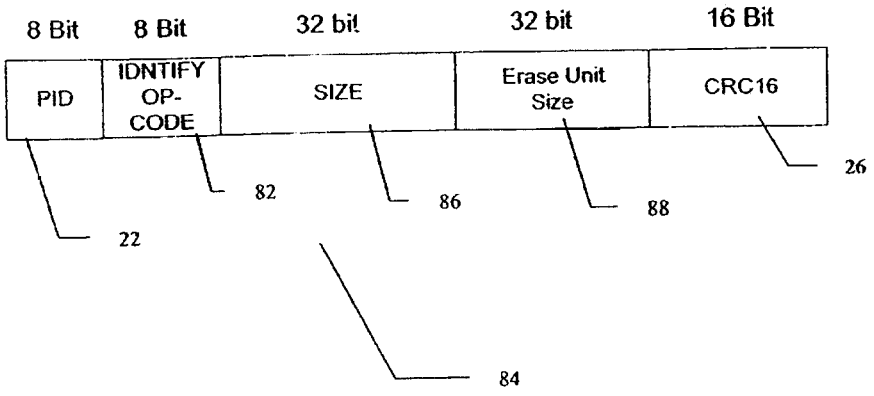
Fig 9 –Write Request Packet
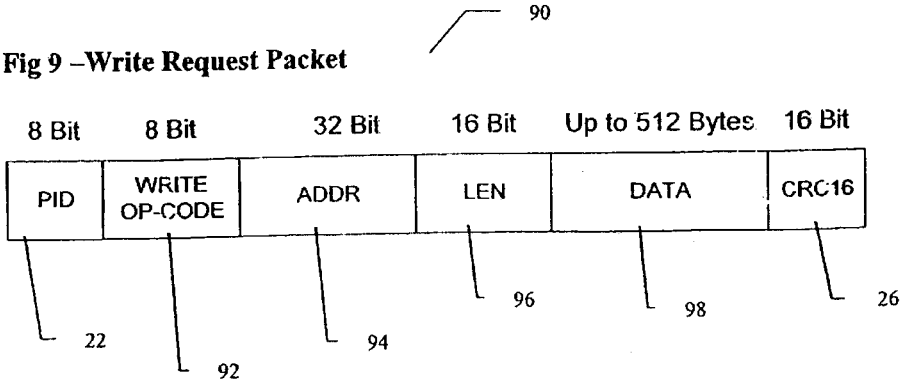

Fig 10 – Write Status Packet
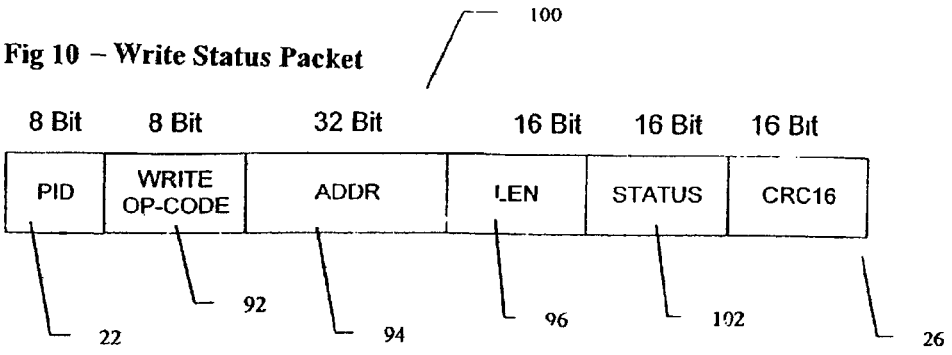
Fig 11 – Read Request Packet
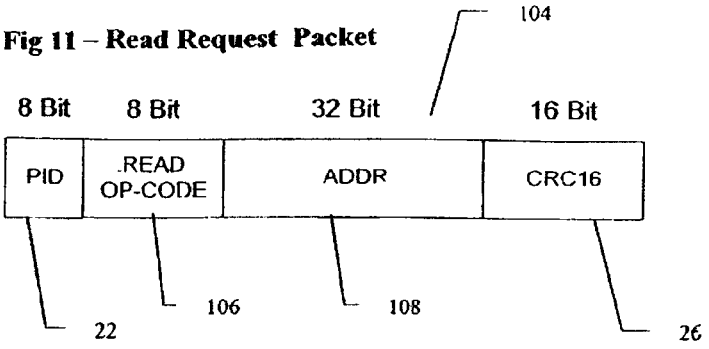
Fig 12 – Read Status Packet
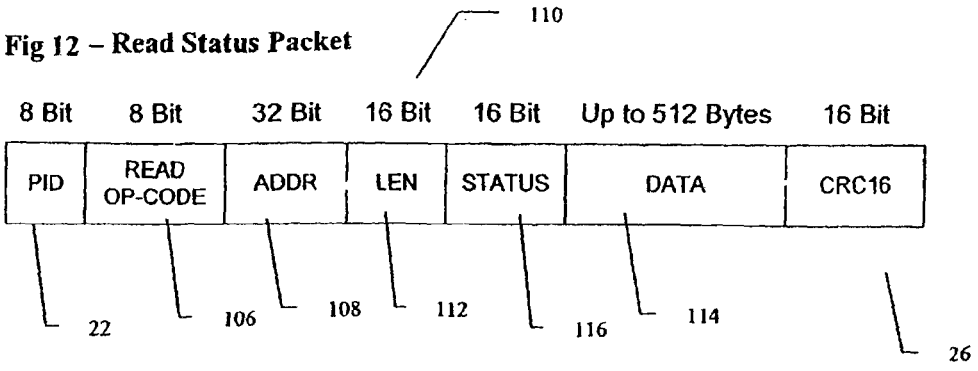

Fig 13 –Erase Request Packet
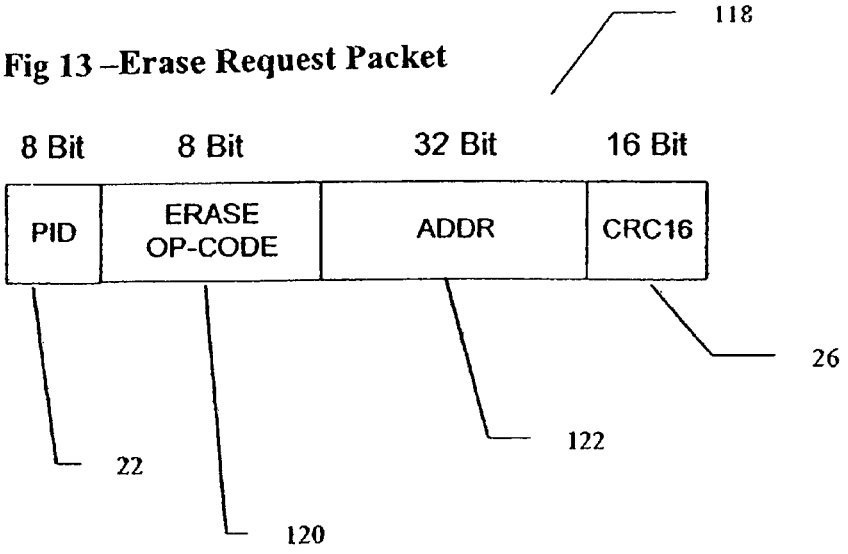
Fig 14 –Erase Status Packet
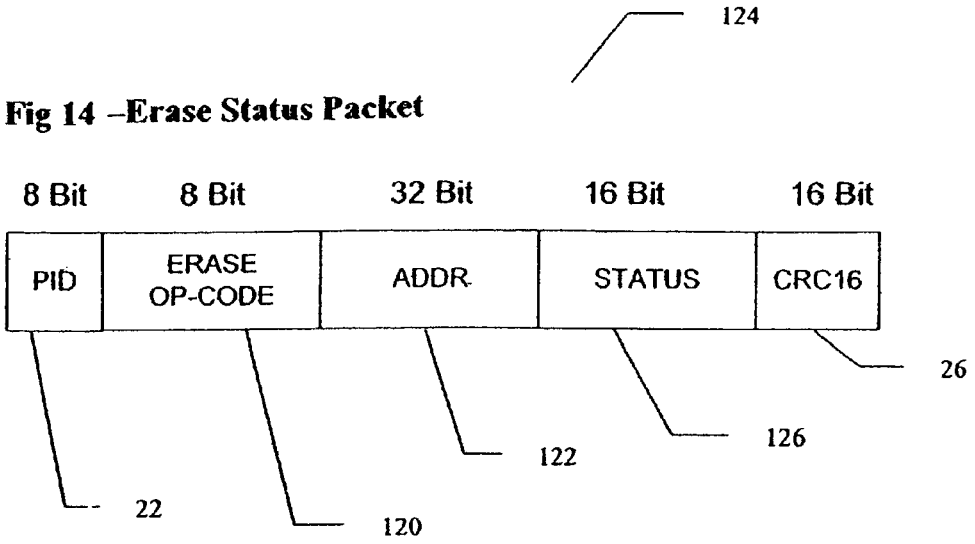

USB FLASH MEMORY DEVICE WITH INTEGRAL MEMORY TECHNOLOGY DRIVER

Matter enclosed in heavy brackets [ ] appears in the original patent but forms no part of this reissue specification; matter printed in italics indicates the additions made by reissue.

*RELATED APPLICATIONS*

*This application is a continuation reissue application of reissue application Ser. No. 10/292,868, filed Nov. 13, 2002 now U.S. Pat. No. Re. 42,443, which is a reissue application of U.S. Ser. No. 09/285,706, filed on Apr. 5, 1999, now U.S. Pat. No. 6,148,354, issued on Nov. 14, 2000.*

*More than one reissue application has been filed for the reissue of U.S. Pat. No. 6,148,354. The reissue applications are application Ser. No. 10/292,868, filed Nov. 13, 2002, now U.S. Pat. No. Re. 42,443, issued on Jun. 7, 2011; Ser. No. 10/293,986, filed Nov. 14, 2002, now U.S. Pat. No. Re. 42,397, issued on May 24, 2011; Ser. No. 13/005,505, titled "USB Flash Memory Device with Integrated USB Controller," filed Jan. 12, 2011, and Ser. No. 13/005,501, (the present application), filed Jan. 12, 2011, all of which are reissues of U.S. Pat. No. 6,148,354 and are hereby incorporated by reference in their entirety.*

FIELD AND BACKGROUND OF THE INVENTION

The present invention is related to semiconductor memory devices, and in particular to erasable and programmable non-volatile memory modules which are connected to a host platform using the USB PC Bus.

Erasable and programmable non-volatile memory modules, hereinafter referred to as flash memory or flash devices, are known in the art for storage of information. Flash devices include electrically erasable and programmable read-only memories (EEPROMs) made of flash-type, floating-gate transistors and are non-volatile memories similar in functionality and performance to EPROM memories, with an additional functionality that allows an in-circuit, programmable, operation to erase pages of the memory. One example of an implementation of such a flash device is given in U.S. Pat. No. 5,799,168, incorporated by reference as if fully set forth herein.

Flash devices have the advantage of being relatively inexpensive and requiring relatively little power as compared to traditional magnetic storage disks. However, in a flash device, it is not practical to rewrite a previously written area of the memory without a preceding page erase of the area. This limitation of flash devices causes them to be incompatible with typical existing operating system programs, since data cannot be written to an area of memory within the flash device in which data has previously. been written, unless the area is first erased. A software management system, such as that disclosed in U.S. Pat. No. 5,404,485, filed on Mar. 5, 1993, which is incorporated as if fully set forth herein, is required to manage these functions of the flash memory device.

Currently, these flash memory devices have a second limitation, which is that they must be either attached statically to the host platform, or attached and detached dynamically using the PCMCIA [Personal Computer Memory Card International Association] interface. Both implementations have drawbacks, including difficulty of use and high cost.

A more useful implementation would follow the USB standard, as described in the USB Specification Version 1.1 which is incorporated as if fully set forth herein. The USB standard offers a smaller form factor and greater ease of use for the end user, while lowering the cost of the implementation. This standard is specified to be an industry-wide standard promoted by companies such as Compaq Computer Corporation, Microsoft, IBM and Intel to serve as an extension to the PC architecture with a focus on Computer Telephony Integration (CTI), the consumer, and productivity applications.

The criteria which were applied to define the architecture for the USB standard include the ease of PC (personal computer) peripheral expansion, low cost, support of transfer rates up to 12 Mb/second and full support for real-time data, voice, audio, and compressed video. This standard also offers protocol flexibility for mixed-mode isochronous data transfers and asynchronous messaging, integration in commodity device technology and provision of a standard interface for rapid integration into any given host product. In addition, the USB standard represents a single model for cabling and attaching connectors, such that all of the details of the electrical functions, including bus terminations, are isolated from the end user. Through the standard, the peripheral devices are self-identifying, and support automatic mapping of functions to a driver. Furthermore, the standard enables all peripheral devices to be dynamically attachable and re-configurable.

A system constructed according to the USB standard is described by three separate, defined areas: USB interconnection, USB devices and the USB host platform. The USB interconnection is the manner in which USB devices are connected to, and communicate with, the host platform. The associated functions and components include the bus topology, which is the connection model between USB devices and the host platform.

The USB physical interconnection has a tiered star topology. A hub is at the center of each star. Each wire segment is a point-to-point connection between the host platform and a hub or function, or a hub connected to another hub or function.

In terms of a capability stack, the USB tasks which are performed at each layer in the system include a data flow model and a schedule. A data flow model is the manner in which data moves in the system over the USB between data producers and data consumers. A schedule determines access to the interconnection, which is shared. Such scheduling enables isochronous data transfers to be supported and eliminates arbitration overhead.

The USB itself is a polled bus. The host controller on the host platform initiates all data transfers. All bus transactions involve the transmission of up to three packets. Each transaction begins when the host controller, on a scheduled basis, sends a USB packet describing the type and direction of transaction, the USB device address, and endpoint number. This packet is referred to as the "token packet." The USB device, to which the packet is addressed, selects itself by decoding the appropriate address fields. In a given transaction, data is transferred either from the host platform to a device or from a device to the host platform. The direction of data transfer is specified in the token packet. The source of the transaction then sends a data packet or indicates that the source has no data to transfer. The destination, in general, responds with a handshake packet indicating whether the transfer was successful.

The USB data transfer model between a source and destination on the host platform and an endpoint on a device is referred to as a "pipe". There are two types of pipes: stream and message. Stream data has no USB-defined structure, while message data does. Additionally, pipes have associations of data bandwidth, transfer service type, and endpoint characteristics like directionality and buffer sizes. Most pipes come into existence when a USB device is configured. One message pipe, the default control pipe, always exists once a device is powered, in order to provide access to the configuration, status, and control information for the device.

The transaction schedule for the USB standard permits flow control for some stream pipes. At the hardware level, this prevents situations in which buffers experience underrun or overrun, by using a NAK handshake to throttle the data rate. With the NAK handshake, a transaction is retried when bus time is available. The flow control mechanism permits the construction of flexible schedules which accommodate concurrent servicing of a heterogeneous mix of stream pipes. Thus, multiple stream pipes can be serviced at different intervals with packets of different sizes.

The USB standard, as described, has three main types of packets, including token packets, data packets and handshake packets. An example of each type of packet is shown in background art FIGS. 1-3. Background art FIG. 4 shows an exemplary USB abstract device.

A token packet 10, as shown in background art FIG. 1, features a PID (packet identification) field 12, specifying one of three packet types: IN, OUT, or SETUP. If PID field 12 specifies the IN packet type, the data transaction is defined from a function to the host platform. If PID field 12 specifies the OUT or SETUP packet type, the data transaction is defined from the host platform to a function.

An ADDR field 14 specifies the address, while an ENDP field 16 specifies the endpoint for token packet 10. For OUT and SETUP transactions, in which PID field 12 specifies that token packet 10 is an OUT packet type or a SETUP packet type, ADDR field 14 and ENDP field 16 uniquely identify the endpoint for receiving the subsequent data packet, shown in FIG. 2, which follows after token packet 10. For IN transactions, in which PID field 12 specifies that token packet 10 is an IN packet type, ADDR field 14 and ENDP field 16 uniquely identify which endpoint should transmit a data packet. A CRC5 field 18 contains the checksum, for determining that token packet 10 has been received without corruption. Only host platform can issue token packets 10, such that token packets 10 provide control over transmission of the subsequent data packets.

As shown in background art FIG. 2, a background art USB data packet 20 also features a PID (packet identification) field 22 for identifying the type of data packet. Data packet 20 also features a data field 24 for optionally, containing data, and a CRC field 26 for containing the checksum as previously described.

Background art FIG. 3 shows a background art USB handshake packet 28, which features only a PID (packet identification) field 30. Handshake packets 28 are used to report the status of a data transaction and can return values indicating successful reception of data, command acceptance or rejection, flow control, and halt conditions. Only transaction types which support flow control can return handshake packets 28. Handshake packets 28 are always returned in the handshake phase of a transaction and may be returned, instead of data packets 20, in the data phase of a transaction.

These three different types of packets are exchanged during various phases of the transaction which includes a USB device. A schematic block diagram of the functional blocks in a typical USB device 32 is shown in FIG. 4 for an abstract background art USB device. USB device 32 typically includes a USB electrical interface 34, featuring a cable and a connector, which is a physical interface for receiving and transmitting electrical signals which are compatible with the USB specification as previously described. The signals are then passed to a logical interface 36, which includes one or more buffers, the device address decoder for decoding the address of the source device for the signals, and a SYNC field synchronizer for synchronizing the signals. Information and structures required for management of USB abstract device 32 as a USB device are stored in a USB class control and enumeration engine 38. A function and device engine 40, also termed the "application"; controls and manages the specific functions and properties of USB abstract device 32. In addition, function and device engine 40 also consumes and produces most of the data over the USB bus.

The USB specification does not define the relationship between different entities in USB abstract device 32, however. Rather, the USB specification describes only the requirements for the packets, and for the electrical and physical connection between USB abstract device 32 and the bus. Therefore the connections and relationships shown in background art FIG. 4 are only one example of an implementation which fulfills the requirements of the USB specification. Thus, any specific device for fulfilling the USB specification must have a specifically defined and described architecture.

Unfortunately, no such architecture exists for a flash memory device containing one or more flash memory modules, which would enable the flash memory device to connect to a bus defined according to the USB specification and thereby to form part of a USB system on a host platform. For example, U.S. Pat. No. 5,799,168 does not teach or suggest such an implementation for the flash device. As mentioned previously, such an architecture would be particularly useful for a number of reasons, including low cost, ease of use and transparency to the end user.

There is thus a need for, and it would be useful to have, an architecture for defining and describing a flash memory device which is compatible with a USB system and which follows the USB specification, such that the flash memory device could sit on a USB-defined bus and communicate with the host platform through this bus.

BRIEF DESCRIPTION OF THE DRAWINGS

FIG. 1 is a schematic block diagram of a background art USB token packet structure;

FIG. 2 is a schematic block diagram of a background art USB data packet structure;

FIG. 3 is a schematic block diagram of a background art USB handshake data packet structure;

FIG. 4 is a schematic block diagram of an exemplary background art USB device;

FIG. 5 is a schematic block diagram of a system with a flash USB device functionality according to the present invention;

FIG. 6 is a schematic block diagram of the USB Flash disk;

FIG. 7 is a schematic block diagram of a flash identification request packet;

FIG. 8 is a schematic block diagram of a flash identification status packet;

FIG. 9 is a schematic block diagram of a flash write request packet;

FIG. 10 is a schematic block diagram of a flash write status packet;

FIG. 11 is a schematic block diagram of a flash read request packet;

FIG. 12 is sa schematic block diagram of a flash read status packet;

FIG. 13 is a schematic block diagram of a flash erase request packet; and

FIG. 14 is a schematic block diagram of a flash erase status packet.

SUMMARY OF THE INVENTION

The present invention is of a flash memory device, containing one or more flash modules, in which the flash memory is mapped to the address space of an ASIC or a controller which has a USB-defined electrical interface and a USB-defined logical interface. This controller/ASIC (hereinafter termed a "controller") supports the USB functionality according to the USB standard, thereby supporting enumeration onto the USB bus, as well as data reception and transmission over USB pipes to and from USB endpoints. This controller also supports the functionality and control of the flash memory device, as well as the processing of command and data packets from the host controller. The host controller uses one of several possible protocols, either standard or proprietary, to signal the next command to be performed to the USB flash controller. Thus, the entire device acts as a dynamically attachable/detachable non-volatile storage device for the host platform.

According to the present invention, there is provided a USB flash memory device for connecting to a USB-defined bus, the flash memory device comprising: (a) at least one flash memory module for storing data; (b) a USB connector for connecting to the USB-defined bus and for sending packets on, and for receiving packets from, the USB-defined bus; and (c) a USB controller for controlling the at least one flash memory module and for controlling the USB connector according to at least one packet received from the USB-defined bus, such that data is written to and read from the at least one flash memory module.

Hereinafter, the term "computer" includes, but is not limited to, personal computers (PC) having an operating system such as DOS, Windows™, OS/2™ or Linux; Macintosh™ computers; computers having JAVA™-OS as the operating system; and graphical workstations such as the computers of Sun Microsystems™ and Silicon Graphics™, and other computers having some version of the UNIX operating system such as AIX™ or SOLARIS™ of Sun Microsystems™; or any other known and available operating system, including operating systems such as Windows CE™ for embedded systems, including cellular telephones, handheld computational devices and palmtop computational devices, and any other computational device which can be connected to a network. Hereinafter, the term "Windows™" includes but is not limited to Windows95™, Windows 3.X™ in which "x" is an integer such as "1", Windows NT™, Windows98™, Windows CE™ and any upgraded versions of these operating systems by Microsoft Inc. (Seattle, Wash., USA).

DETAILED DESCRIPTION OF THE INVENTION

The present invention is of a flash memory device, containing one or more flash modules, in which the flash memory is mapped to the address space of an ASIC or a controller which has a USB-defined electrical interface and a USB-defined logical interface. This controller/ASIC (hereinafter termed a "controller") supports the USB functionality according to the USB standard, thereby supporting enumeration onto the USB bus, as well as data reception and transmission over USB pipes to and from USB endpoints. This controller also supports the functionality and control of the flash memory device, as well as the processing of command and data packets from the host controller. The host controller uses one of several possible protocols, either standard or proprietary, to signal the next command to be performed to the USB flash controller. Thus, the entire device acts as a dynamically attachable/detachable non-volatile storage device for the host platform.

While the invention is susceptible to various modifications and can be implemented using many alternative forms, the embodiment is shown by way of example in the drawings and will be described in details in the following pages. It should be understood that one of ordinary skill in the art appreciates that the present invention could be implemented in various other ways. The intention is to cover all modifications and alternatives falling within the spirit of the current invention.

The principles and operation of a USB flash device and system according to the present invention may be better understood with reference to the drawings and the accompanying description, it being understood that these drawings are given for illustrative purposes only and are not meant to be limiting.

Referring now to the drawings, FIG. 5 is a schematic block diagram of the main components of a flash memory device and system according to the present invention. A flash memory system 42 includes a host platform 44 as shown. Host platform 44 operates USB flash device 46 as a non-volatile storage space.

Host platform 44 is connected to USB flash device 46 according to the present invention through a USB cable 48. Host platform 44 connects to USB cable 48 through a USB host connector 50, while USB flash device 46 connects to USB cable 48 through a USB flash device connector 52. Host platform 44 features a USB host controller 54 for controlling and managing all USB transfers on the USB bus.

USB flash device 46 features a USB flash device controller 56 for controlling the other components of USB flash device 46 and for providing an interface for USB flash device 46 to the USB bus, USB flash device connector 52 and at least one flash memory module 58. Flash memory module 58 is preferably an array of flash memory modules 58 in which the data is stored.

Whenever USB flash device 46 becomes connected to host platform 44, a standard USB enumeration process takes place. In this process host platform 44 configures USB flash device 46 and the mode of communication with USB flash device 46. Although there are many different methods for configuring USB flash device 46, for the purposes of clarity only and without intending to be limiting, the present invention is explained in greater detail below with regard to a method in which host platform 44 issues commands and requests to USB flash device 46 through one endpoint. Host platform 44 queries USB flash device 46 through the other endpoint for status changes, and receives related packets if any such packets are waiting to be received.

Host platform 44 requests services from USB flash device 46 by sending request packets to USB host controller 54. USB host controller 54 transmits packets on USB cable 48. These requests are received by USB flash device controller 56 when USB flash device 46 is the device on the endpoint of the request. USB flash device controller 56 then performs various operations such as reading, writing or erasing data from or to flash memory module(s) 58, or supporting basic USB functionality such as device enumeration and configuration. USB flash device controller 56 controls flash memory module(s) 58 by using a control line 60 to control the power of flash memory module(s) 58, and also through various other signals such as chip enable, and read and write signals for example. Flash memory module(s) 58 are also connected to USB flash device controller 56 by an address/data bus 62. Address/data bus 62 transfers commands for performing read, write or erase commands on flash memory module(s) 58, as well as the addresses and data for these commands as defined by the manufacturer of flash memory module(s) 58.

In order for USB flash device 46 to notify host platform 44 on the result and status for different operations requested by host platform 44, USB flash device 46 transmits status packets using the "status end point". According to this procedure, host platform 44 checks (polls) for status packets and USB flash device 46 returns either an empty packet if no packets for new status messages are present, or alternatively returns the status packet itself.

A more detailed structure of the functional components of USB flash device 46 is shown in FIG. 6. USB flash device 46 includes the physical and electrical interface defined for the USB standard, shown here as USB flash device connector 52 and a connector interface 64. USB flash device connector 52 receives the electrical signals from USB cable 48 which carries electrical signals from host controller (not shown). These signals are then passed through connector interface 64. Every millisecond, a USB frame is carried on the USB-defined bus, such that packets could be sent to USB flash device 46.

Connector interface 64 then receives these packets through a first interface component, which is a combined physical and logical interface 66. A functional interface 68 is specifically designed to receive token packets as defined in the USB specification and as previously described with regard to FIG. 1. These token packets are related only to particular functional aspects of USB flash device 46 which are required for the USB standard, and do not have any relation to particular application of USB flash device 46 as a flash disk according to the present invention. These token packets and their respective returned data packets enable USB host controller 54 (not shown) and host platform 44 (not shown) to identify USB flash device 46 and allocate resources for USB flash device 46 on the USB bus. Thus, functional interface 68 only supports USB functionality needed for the identification and registration of USB flash device 46 on the USB bus.

USB flash device 46 also features an application packet extractor 70 which extracts the application data and commands from the USB application packets, such that application packet extractor 70 supports only application related packets. Next, any requests to USB flash device 46 by host platform 44 (not shown), in the form of read, write, identify and erase commands, are interpreted by an application command interpreter 72. For any commands which involve data or an address, such as read, write and erase commands, an address resolve module 74 translates the address from the logical address space to the physical address space. Host platform 44 (not shown) relates to a linear address space of logical addresses, while USB flash device 46 contains at least one, and preferably a plurality of, flash modules 58, each of which has a physical address space. Thus, a translation must be performed between the logical address space of host platform 44 (not shown) and physical address space or spaces of USB flash device 46. There are many ways to implement such a translation which are suitable for the present invention. One example of a suitable implementation of an address translation method is described with regard to U.S. Pat. No. 5,404,485, previously incorporated by reference as if fully set forth herein, which teaches a method for managing a flash memory as a flash disk and which is suitable for operation with the present invention.

A data handler 76 handles data related aspects of any received commands, and conveying the data through functional interface 68 to and from flash module(s) 58. Optionally and preferably, data handler 76 performs any error correction and detection methods. Application command interpreter 72, data handler 76 and address resolve module 74 all operate with an underlying Memory Technology Driver (MTD) 78 to write, read or erase a particular flash module 58 and the desired address on that flash module 58.

Host platform 44 checks for status changes in USB flash device 46 and reads status packets from USB flash device 46 when a new status packet is available. Using these status packets, USB flash device 46 can transmit, to host platform 44, the results of different commands issued by host platform 44 in its requests (not shown). For example, the read command status packet contains one of the available status words such as "success", "error" or "invalid address", which enables host-platform 44 to determine the result of the read command (not shown). Similarly, the erase status packet contains a status word indicating the completion of the erase process. A write status packet is used by USB flash device 46 to notify host platform 44 about the result of the write command, for example whether the command was successful or erroneous, and whether USB flash device 46 is ready for additional write requests from host platform 44.

A Memory Technology Driver, or MTD 78 typically contains routines to read, write and erase the flash memory device controlled by the controller operating MTD 78. In addition, MTD 78 optionally contains an identification routine for recognizing the proper type of flash memory device for which MTD 78 was designed, so that the controller can determine which MTD should be activated upon interacting with a particular flash memory device array. In addition, an identification routine should be able to detect the size of the array of flash memory devices, including the number of flash memory devices within the array, and various features of the flash array geometry, such as interleaving and bus width. This information later enables host platform 44 platform to determine the address space and size of the storage media. U.S. Pat. No. 5,799,168, previously incorporated by reference, discloses an example of such an MTD for a flash device.

Using the above described protocol and architecture, host platform 44 can optionally implement any application which is implementable with any regular memory mapped or I/O mapped flash memory device. For example, host platform 44 can give a standard block device interface to each application, such as a magnetic storage medium "hard disk" drive, as disclosed in the previously described U.S. Pat. No. 5,404,485.

As an example of a preferred embodiment of the present invention, the operation of a host system connected to a USB flash device according to the present invention is described with regard to the processes of identifying, programming, reading and erasing the flash device. For the purposes of illustration only and without intending to be limiting in any way, the exemplary USB flash device has an array of two flash memory modules, each of which is 64 Mbit in size. The address translation table is within the flash device so that host platform operates with logical addresses. All commands and return codes between the flash device and the host platform are carried on USB data packets, and are transferred through USB data pipes. The exact structure of the packets, pipes and timings are described in the USB specification.

The operation of the exemplary device and system according to the present invention is as follows. When the USB flash device is first connected to the host platform, the USB host controller assigns an address to the USB flash device on the USB bus, and also assigns resources as described in the USB specification. The USB flash device actually asks the host platform to assign these resources, and must inform the host platform how much of these resources are needed. Thus, the USB flash disk can optionally support slower device speeds if the USB host platform has already allocated resources to other devices.

The USB controller also negotiates with the flash modules and determines the size and manufacturing type of these modules. The controller then builds an identification structure holding this information, as well as the translation table and logical address space.

After the USB host controller identifies the USB flash device, the host platform often uploads a USB client driver. The driver issues an identification request command to the USB host controller, causing the controller to transmit an identification data packet 80, shown in FIG. 7. Identification packet 80 contains PID field 22 and checksum field 26, as described previously for background art FIG. 2. Identification packet 80 also contains an "identify" operation code in an operation code field 82. The packet extractor of the USB flash device receives identification data packet 80 and transfers the operating code of the "identify" command to the application command interpreter.

In response to the "identify" command, the flash device then sends an identification data packet 84, shown in FIG. 8. In addition to the fields shown in FIG. 7, identification data packet 84 also contains information about the size of the flash device in a flash device size field 86, as well as information about the size of the minimal erase unit for erasing the flash memory in an erase unit size field 88.

All of the packets described in this example are only data packets which are sent on the USB bus. Before each data packet is sent, a USB token packet is transmitted, instructing the USB controller as to the identity of the device end point to which the data packet should be transmitted. Upon successful reception of the packet, the USB controller issues a USB ACK packet as described in the USB specification.

Once the device drivers in the host platform receive this status packet, the drivers can start issuing read and write commands to the USB flash device with the application commands. When a write request is sent, a USB data packet with the operation code for the "write" command, and the buffer containing the data, is transferred to the USB flash device. A write data packet 90 is shown in FIG. 9, which again includes the fields shown previously in FIG. 8, except that write data packet 90 also includes a write field 92 with the "write" operational code; an ADDR field 94 with the logical address to be written; a LEN field 96 with the length to be written; and a DATA field 98 which contains the actual data to write. The packet extractor extracts the operational code from write data packet 90 and transfers this code to the application command interpreter. The logical address is transferred to the address resolve module which translates this logical address to a physical address on one of the flash modules. The data handler optionally calculates error correction and detection mechanisms if employed by the USB flash device. Once all of the flash memory modules are ready, a "write" command is sent to the flash module or modules containing the physical address, which may optionally span across more than one flash module to the MTD block. The MTD block then issues a "write" command on the data/address bus which connects the flash modules to the USB device controller. Once the operation is complete and a status packet is returned to the MTD, the result of the operation is transmitted to the host controller and passed to the device driver in the host platform.

When the flash controller finishes the writing process, the controller signals to the host platform that the status of the USB flash memory device has changed, by sending a "write status" packet 100, as shown in FIG. 10. In place of data field 98, write status packet 100 contains a status field 102. The host platform reads the status packets from the flash memory device, and from write status packet 100, the host platform retrieves information on the completion status of the write command by reading status field 102. In this example, the flash memory device repeats ADDR field 94 and LEN field 96 in order for the host platform to have a reference to the specific command related to status packet 100.

As shown in FIG. 11, a "read request" packet 104 contains the operation code for the "read" command in a read field 106, and the logical address of the desired location from which the flash controller should read in an ADDR field 108. Upon receiving this command, the flash controller issues a read command to the MTD block, after the address resolve module has translated the address contained in ADDR field 108 to a specific physical address in one of the flash components.

When the flash controller receives the data from the flash device, either after the read command was issued, or if an error occurred, the flash controller sends a signal to the host platform to indicate that a new status packet must be read. The host platform issues a read request and receives a "read status" packet 110 as shown in FIG. 12. Read status packet 110 contains the address of the read data in ADDR field 108, as well as the length of the read data in a LEN field 112 and the data itself in a data field 114. Read status packet 110 also features the status word, according to which the operation was completed, in a status field 116. The read operation can be completed with many different status situations such as success, fail, error detected, invalid address, invalid length and so forth.

When the host platform needs to erase an erase unit in the flash device, the host platform issues an "erase request" packet 118, shown in FIG. 13. This packet contains the "erase" operation code in an erase field 120, and the logical address of the erase unit in an ADDR field 122. Upon receiving such a request, the flash controller translates the logical address to a physical erase unit address on one of the physical address spaces of the flash modules, and issues an erase command to the MTD block.

The erase process generally takes more time then a read or write process. When this erase process is finished, the controller notifies the host platform a new status packet is ready to transmit. The controller then transmits an "erase status" packet 124, as shown in FIG. 14. Erase status packet 124 contains the address of the erased unit in ADDR field 122, thereby providing the host platform with a reference to the erase requests. The status according to which the operation was completed is provided in a status field 126.

It will be appreciated that the above descriptions are intended only to serve as examples, and that many other embodiments are possible within the spirit and the scope of the present invention.

What is claimed is:

[1. A USB flash memory device for connecting to a USB-defined bus, the flash memory device comprising:

(a) at least one flash memory module for storing data;

(b) a USB connector for connecting to the USB-defined bus and for sending packets on, and for receiving packets from, the USB-defined bus;

(c) a USB controller for controlling said at least one flash memory module and for controlling said USB connector according to at least one packet received from the USB-defined bus, such that data is written to and read from said at least one flash memory module;

(d) an electrical interface for connecting to said USB connector and for receiving said packets from said USB connector as a plurality of electrical signals;

(e) a logical interface for connecting to said electrical interface and for translating said plurality of electrical signals to logic signals, said logic signals being passed to said at least one flash memory module;

(f) a functional interface for receiving said logic signals such that if said logic signals represent a USB functional packet, said functional interface sends a USB command to said USB controller according to said USB functional packet;

(g) an application packet extractor for connecting to said logical interface and for receiving said logic signals, said application packet extractor extracting at least one packet from said logic signals; and (h) an application command interpreter for receiving said at least one packet and for determining a command according to said at least one packet, said command being passed to said USB controller.]

[2. The flash memory device of claim 1, further comprising:

(i) an address resolver module for receiving said at least one packet and for resolving an address contained in said at least one packet, said address being sent to said USB controller, such that said command is performed according to said address.]

[3. The flash memory device of claim 2, wherein said command is a write command for writing data to said at least one flash memory module and said address is a logical address for writing said data, such that said address resolver module resolves said logical address to a physical address of said at least one flash memory module.]

[4. The flash memory device of claim 2, wherein said command is a read command for reading data from said a least one flash memory module and said address is a logical address for reading said data, such that said address resolver module resolves said logical address to a physical address of said at least one flash memory module.]

[5. The flash memory device of claim 2, further comprising:

(j) a data handler for performing an error detection and correction routine for said at least one flash memory module.]

[6. The flash memory device of claim 5, further comprising:

(k) a status handler for receiving said USB functional packet from said functional interface, and for sending a status packet concerning a status of said at least one flash memory module according to said USB functional packet.]

[7. The flash memory device of claim 6, further comprising:

(l) a MTD (memory technology driver) for receiving a write command and physical address of said at least one flash memory module, and for performing said write command to said physical address.]

*8. A USB flash memory device for connecting to a USB-defined bus, the flash memory device comprising:*

*at least one flash memory module;*

*a USB connector adapted for connection to a USB-defined bus; and*

*a USB controller configured to send and receive USB-defined packets, including USB-defined data packets, to or from a host via the USB-defined bus and the USB connector, and to carry out at least one of reads, writes and erases in the at least one flash memory module in accordance with the USB-defined data packets, wherein the USB controller comprises*

*a packet extractor to extract operation codes and logical addresses from the USB-defined data packets, and*

*a command interpreter adapted to interpret the operation codes into corresponding commands; and*

*an identification structure for holding memory size and manufacturing type information of the at least one flash memory module, which information is determined by the USB controller;*

*wherein the USB controller is configured to activate a respective memory technology driver in accordance with the memory size and manufacturing type information in the identification structure, wherein the activated memory technology driver is configured to perform the commands on the at least one flash memory module corresponding to the logical addresses.*

*9. The USB flash memory device according to claim 8, wherein the USB controller is configured to build an address translation table in accordance with the memory size and manufacturing type information, and to convert the logical addresses into physical addresses of the at least one flash memory module using the address translation table.*

*10. The USB flash memory device according to claim 8, further comprising:*

*an address resolver module which is adapted to convert a respective logical address extracted from the USB-defined data packets into a respective physical address of the at least one flash memory module.*

*11. The USB flash memory device according to claim 10, wherein, if one of the commands is a write command for writing data to the at least one flash memory module and the logical address is a logical address for writing the data, the address resolver module is configured to convert the logical address into a physical address of the at least one flash memory module.*

*12. The USB flash memory device according to claim 10, wherein, if one of the commands is a read command for reading data from the at least one flash memory module and the logical address is a logical address for reading the data, the address resolver module is configured to convert the logical address into a physical address of the at least one flash memory module.*

*13. The USB flash memory device according to claim 8, wherein the USB controller is implemented as a single integrated circuit.*

*14. The USB flash memory device according to claim 8, further comprising:*

*a control line for interconnecting the USB controller and the at least one flash memory module, wherein the USB controller is configured to use the control line to control a power of the at least one flash memory module.*

*15. The USB flash memory device according to claim 8, wherein the USB controller is configured to negotiate with the at least one flash memory module to determine at least one feature of the at least one flash memory module.*

*16. The USB flash memory device according to claim 15, wherein the USB controller is configured to notify the host that it is ready for use after the negotiation.*

*17. The USB flash memory device according to claim 16, wherein the notification includes at least one USB-defined data packet.*

*18. The USB flash memory device according to claim 8, wherein the USB connector is attached to a combined physical/logical interface.*

*19. The USB flash memory device according to claim 18, wherein the combined physical/logical interface is part of the USB controller and is coupled to the packet extractor.*

*20. The USB flash memory device according to claim 8, wherein the at least one flash memory module comprises a plurality of flash memory modules.*

*21. The USB flash memory device according to claim 20, wherein the USB controller includes a plurality of chip enable signal lines for attaching to the plurality of flash memory modules.*

*22. The USB flash memory device according to claim 8, wherein the flash memory device is configured to act as a dynamically attachable/detachable non-volatile storage device for the host.*

*23. A data-processing method performed by a USB flash memory device, wherein the USB flash memory device includes at least one flash memory module, a USB controller operatively coupled to the at least one flash memory module, and a USB connector adapted for operatively connecting the at least one flash memory module and the USB controller to a host via a USB-defined bus, the method comprising:*

*under the control of the USB controller:*

*conveying USB-defined packets, including USB-defined data packets, to or from the host via the USB-defined bus and the USB connector;*

*determining memory size and manufacturing type information of the at least one flash memory module;*

*activating a memory technology driver in accordance with recognition of a type of the at least one flash memory module;*

*extracting one of a read, write and erase command from at least one of the USB-defined data packets; and*

*interpreting the read, write or erase command extracted from at least one of the USB-defined data packets into a corresponding read, write or erase action, each command having an associated logical address; and*

*performing the corresponding read, write or erase action in the at least one flash memory module corresponding to the logical address using the activated memory technology driver.*

*24. The data-processing method according to claim 23, further comprising:*

*storing the memory size and manufacturing type information in an identification structure of the USB controller.*

*25. The data-processing method according to claim 23, further comprising:*

*building an address translation table in accordance with the memory size and manufacturing type information; and*

*converting the logical address into a physical address of the at least one flash memory module using the address translation table.*

*26. The data-processing method according to claim 25, further comprising:*

*in connection with extracting a write command,*

*extracting a predefined amount of data from the at least one of the USB-defined data packets; and*

*writing the predefined amount of data into locations including the physical address in accordance with the write command.*

*27. The data-processing method according to claim 25, further comprising:*

*in connection with extracting a read command,*

*retrieving data from locations including the physical address in accordance with the read command; and*

*transmitting the retrieved data to the host via the USB connector and the USB-defined bus.*

*28. The data-processing method according to claim 23, further comprising:*

*under the control of the USB controller, negotiating with the at least one flash memory module to determine at least one feature of the at least one flash memory module.*

*29. The data-processing method according to claim 28, further comprising:*

*under the control of the USB controller, notifying the host after its negotiation with the at least one flash memory module.*

*30. A USB storage device, comprising:*

*a USB flash memory unit with one or more flash memory modules, the USB flash memory unit further comprising:*

*a USB connector configured according to a USB standard for connecting to a USB-defined bus; and*

*a USB controller connected between the one or more flash memory modules and the USB connector,*

*wherein the USB controller is configured to support dual functionality including USB functionality according to the USB standard and memory functionality and control of the one or more flash memory modules,*

*wherein the dual functionality includes physical, logical and functional interfaces for processing incoming USB packets and outgoing USBs packets, including USB token and USB application packets, application commands and data extraction from USB application packets, interpretation of application commands, including read, write, erase, and identify commands, translation of logical addresses to physical addresses, and memory operations, including read, write and erase operations.*

*31. A USB storage device as in claim 30, wherein the one or more flash memory modules are mapped to an address space of the USB controller.*

*32. A USB storage device as in claim 30, wherein the USB controller is an integrated circuit (IC).*

*33. A USB storage device as in claim 30, wherein the USB controller is an application-specific integration circuit (ASIC).*

*34. A USB storage device as in claim 30, wherein the USB application packets include customized USB data packets, such customized USB data packets being customized according to the USB standard.*

*35. A USB storage device as in claim 34, wherein the customized USB data packets are in any one of a plurality of data packet forms, including in the form of an identification request packet with an identify operation code, an identification reply packet with an identify operation code and an erase unit size field, a write request packet with a write operation code, a write status packet with a write operation code and a status field, a read request packet with a read operation code, a read status packet with a read operation code and a read status field, an erase request packet with an erase operation code, and an erase status data packet with an erase operation code and an erase status field.*

*36. A USB storage device as in claim 30, further comprising memory technology drivers (MTD), each MTD configured for recognizing a type of flash memory modules for which the MTD was designed and interacting with respective flash memory modules of said type under the control of the USB controller, wherein the USB controller is configured to determine which distinct MTD to activate for a respective flash memory module based on type information of the flash memory module.*

*37. A USB storage device as in claim 30, wherein the dual functionality includes a plurality of MTDs, each MTD containing routines to perform the memory operations.*

*38. A USB storage device as in claim 30, wherein the USB flash memory unit includes a plurality of the flash memory modules.*

*39. A USB storage device as in claim 30, wherein the USB connector is integrally formed with the USB flash memory unit and is able to protrude therefrom to facilitate connection to the USB-defined bus.*

*40. A USB storage device as in claim 30, wherein, under the control of the USB controller, when the USB flash memory unit is connected to a host via the USB-defined bus,*

*the USB connector is configured to convey the incoming USB packets sent from the host to the USB controller and convey the outgoing USB packets received from the USB controller to the host.*

*41. A method for communication between a USB storage device and a host, wherein the USB storage device includes a USB flash memory unit with one or more flash memory modules, the USB flash memory unit further comprising a USB connector configured according to a USB standard for connecting to a USB-defined bus and a USB controller connected between the one or more flash memory modules and the USB connector, the USB storage device is connected to the host via the USB-defined bus, the method comprising:*

*receiving one or more incoming USB packets sent from the host to the USB storage device via the USB-defined bus; and*

*in response to the one or more incoming USB packets, the USB controller*

*performing memory operations to the one or more flash memory modules according to the one or more incoming USB packets;*

*generating one or more outgoing USB packets according to results of performing the one or more operations; and*

*sending the one or more outgoing USB packets to the host from the USB storage device via the USB-defined bus;*

*wherein the USB controller is configured to support dual functionality including USB functionality according to the USB standard and memory functionality and control of the one or more flash memory modules,*

*wherein the dual functionality includes physical, logical and functional interfaces for processing incoming and outgoing USB packets, including USB token and USB application packets, application commands and data extraction from USB application packets, interpretation of application commands, including read, write, erase, and identify commands, translation of logical addresses to physical addresses, and memory operations, including read, write and erase operations.*

*42. A method as in claim 41, wherein the one or more flash memory modules are mapped to an address space of the USB controller.*

*43. A method as in claim 41, wherein the USB controller is an integrated circuit (IC).*

*44. A method as in claim 41, wherein the USB controller is an application-specific integration circuit (ASIC).*

*45. A method as in claim 41, wherein the USB application packets include customized USB data packets, the customized USB data packets being customized according to the USB standard.*

*46. A method as in claim 45, wherein the customized USB data packets are in any one of a plurality of data packet forms, including in the form of an identification request packet with an identify operation code, an identification reply packet with an identify operation code and an erase unit size field, a write request packet with a write operation code, a write status packet with a write operation code and a status field, a read request packet with a read operation code, a read status packet with a read operation code and a read status field, an erase request packet with an erase operation code, and an erase status data packet with an erase operation code and an erase status field.*

*47. A method as in claim 41, wherein the USB storage device further comprises memory technology drivers (MTD), each MTD configured for recognizing a type of flash memory modules for which the MTD was designed and interacting with respective flash memory modules of said type under the control of the USB controller, and wherein the method includes the USB controller determining which distinct MTD to activate for a respective flash memory module based on type information of the flash memory module.*

*48. A method as in claim 41, wherein the dual functionality includes a plurality of MTDs, each MTD containing routines to perform the memory operations.*

*49. A method as in claim 41, wherein the USB flash memory unit includes a plurality of the flash memory modules.*

*50. A method as in claim 41, wherein the USB connector is integrally formed with the USB flash memory unit and is able to protrude therefrom to facilitate connection to the USB-defined bus.*

* * * * *